(12) United States Patent
Agata et al.

(10) Patent No.: US 7,764,108 B2
(45) Date of Patent: Jul. 27, 2010

(54) ELECTRICAL FUSE CIRCUIT

(75) Inventors: Yasuhiro Agata, Osaka (JP); Masanori Shirahama, Shiga (JP); Toshiaki Kawasaki, Osaka (JP); Shinichi Sumi, Hyogo (JP); Yasue Yamamoto, Osaka (JP)

(73) Assignee: Panasonic Corporation, Osaka (JP)

( * ) Notice: Subject to any disclaimer, the term of this patent is extended or adjusted under 35 U.S.C. 154(b) by 59 days.

(21) Appl. No.: 11/976,672

(22) Filed: Oct. 26, 2007

(65) Prior Publication Data

US 2008/0150613 A1    Jun. 26, 2008

(30) Foreign Application Priority Data

Dec. 20, 2006   (JP)   ............................. 2006-342616

(51) Int. Cl.
    *H01H 37/76*   (2006.01)
(52) U.S. Cl. .................... 327/525; 327/526; 365/225.7
(58) Field of Classification Search ................. 327/525, 327/526; 365/96, 225.7
    See application file for complete search history.

(56) References Cited

U.S. PATENT DOCUMENTS

| | | | |
|---|---|---|---|
| 6,462,609 B2 * | 10/2002 | Hashimoto et al. | .......... 327/525 |
| 6,552,946 B2 | 4/2003 | Yokozeki | |
| 6,882,214 B2 | 4/2005 | Spenea et al. | |
| 7,091,768 B2 * | 8/2006 | Lee | .............. 327/525 |
| 7,203,117 B2 | 4/2007 | Agata et al. | |
| 2006/0083046 A1 * | 4/2006 | Agata et al. | ................... 365/96 |

* cited by examiner

*Primary Examiner*—Long Nguyen
(74) *Attorney, Agent, or Firm*—McDermott Will & Emery LLP

(57) ABSTRACT

A gate of a MOS transistor connected to a fuse device in series is controlled by an AND circuit connected to the same power source as the fuse device is connected, thereby pulling down one input of the AND circuit to a ground. Thus, misprogramming of the fuse device when an LSI power source is turned ON/OFF can be prevented.

6 Claims, 4 Drawing Sheets

ELECTRICAL FUSE CIRCUIT

BACKGROUND OF THE INVENTION

The present invention relates to an electrical fuse circuit in which part of a fuse device is blown by passing a current to change a resistance value of the fuse device from a low level to a high level, thereby performing programming.

Conventionally, electrical fuses have been used as programming devices for solving redundancy and the like in a memory in a system LSI.

According to a known technique, a series circuit including a fuse device and a MOS transistor is connected between a program power source and a ground potential on a system LSI. The program power source is used also as a cell power source (VDD_IO, for example, 3.3 V) in an input/output cell region of the system LSI. This is because VDD_IO, which is a higher voltage than a voltage of a power source (VDD_CORE, for example, 1.2 V) of a normal logic circuit is used in order to ensure a large amount of a current flowing for programming a fuse device. Moreover, to perform programming, a control circuit for selecting a fuse device which is to be programmed is needed. For the control circuit, the power source VDD_CORE of a normal logic circuit is used. Therefore, an output at a VDD_CORE voltage level of the control circuit is converted into a signal at a VDD_IO voltage level by a level shifter and the MOS transistor is made conductive by the signal obtained through the conversion, thereby performing programming (see U.S. Pat. No. 7,203,117B2).

However, when a power source of a system LSI is turned ON, there is no certainty that voltages from a VDD_IO power source and a VDD_CORE power source are applied at the same time. For example, when it is assumed that VDD_IO is applied before application of VDD_CORE, a voltage from a power source is applied to a fuse device but not to the control circuit. In such a case, an output of the level shifter becomes unstable, so that the MOS transistor might become conductive and a fuse device might be misprogrammed. This also occurs when the power source is turned OFF.

In recent years, with the popularization of portable commercial products, a technique in which the function of cutting off a voltage from a power source or a ground for each block while equipment is in a halt state is provided in a circuit in a system LSI to suppress a leakage current therein has been used. Also in such a case, for example, if in cutting off a voltage from a power source or a ground, cut-off of a voltage of the power source or the ground in a fuse device side is slightly delayed, an output of a level shifter becomes indefinite, so that a MOS transistor is made conductive and a fuse device is misprogrammed. This also occurs when the power source or the ground is recovered from a cut-off state.

SUMMARY OF THE INVENTION

The present invention has been devised in view of above-described points and it is therefore an object of the present invention to provide an electrical fuse circuit in which a fuse device is not misprogrammed when a power source of an LSI is turned ON/OFF, when part of the power source or the ground is cut off, or when the power source or the ground is recovered from a cut-off state.

To solve the above-described problems, according to the present invention, for an electrical fuse circuit on an LSI, adopted is a configuration including: a series circuit of a fuse device and a MOS transistor; a logic circuit including first and second inputs and a single output for controlling a gate of the MOS transistor; a program power source for supplying a common power source voltage to the series circuit and the logic circuit; a pad for receiving a fuse programming enable signal received from the outside of the LSI and supplying the fuse programming enable signal to the first input of the logic circuit so that when the MOS transistor is made conductive in response to the second input of the logic circuit, a current flows from the program power source to the fuse device and a resistance value of the fuse device is changed; and potential fixing means for fixing a potential of the pad to a nonactivation level of the fuse programming enable signal so that when the fuse programming enable signal is not received, regardless of a state of the second input of the logic circuit, the MOS transistor is kept nonconductive.

According to the present invention, an excellent electrical fuse circuit in which misprogramming of a fuse device is prevented when an LSI is turned ON/OFF, when connection to a power source or a ground is partially cut off or when the power source or the ground is recovered from a cut-off state can be achieved.

DESCRIPTION OF THE PREFERRED EMBODIMENTS

Hereafter, embodiments of the present invention will be described with reference to the accompanying drawings.

Figure 1:
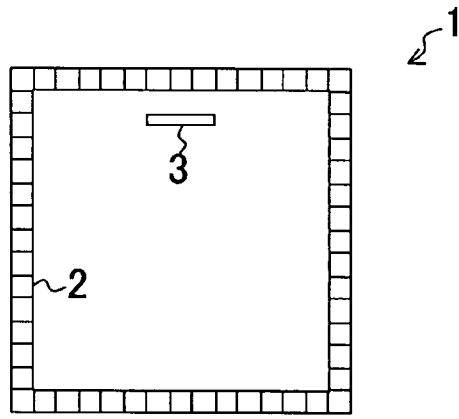
FIG. 1 is a plan view of a system LSI including an electrical fuse circuit according to the present invention.

FIG. 1 is a plan view of a system LSI including an electrical fuse circuit according to the present invention. In FIG. 1, 1 denotes an LSI, 2 denotes an input/output cell region (which will be referred to as an "I/O cell region") and 3 denotes an electrical fuse circuit. In a system LSI 1, an I/O cell region 2 including a number of input/output cells is defined in a peripheral portion of a chip and a normal logic circuit is disposed in part of the chip located in an inner side of the I/O cell region 2. For the purpose of miniaturization, a voltage of a power source (VDD_CORE) of the normal logic circuit is normally 1-1.2 V in the 65 nm process generation. However, a voltage of a power source (VDD_IO) of the I/O cell region 2 depends on a voltage of equipment and a voltage of 3.3 V, 2.5 V, 1.8 V or the like, which is higher than VDD_CORE, is mainly used.

Figure 2:
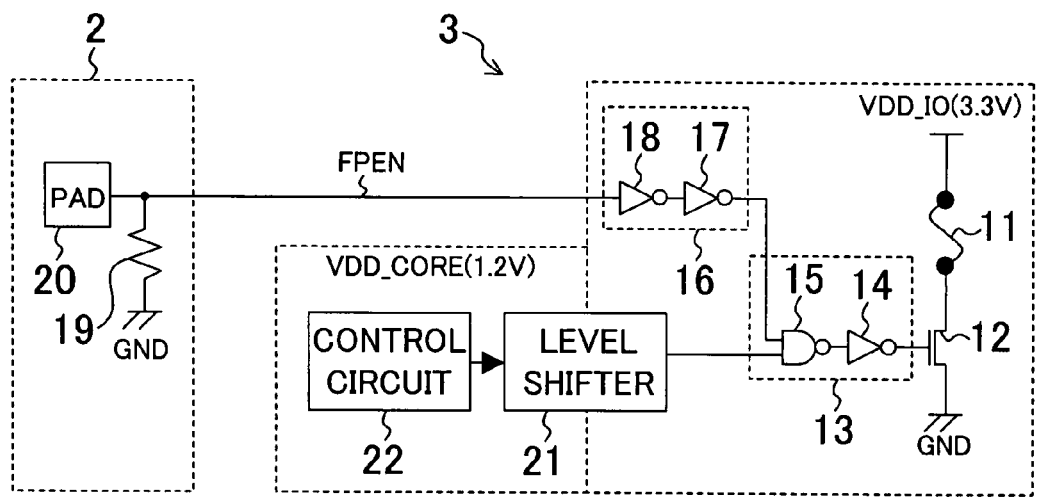
FIG. 2 is a circuit diagram illustrating an exemplary configuration of the electrical fuse circuit of FIG. 1.

FIG. 2 is a circuit diagram illustrating an exemplary configuration of an electrical fuse circuit 3 of FIG. 1. In FIG. 2, 11 denotes a fuse device, 12 denotes an NMOS transistor connected in series with the fuse device 11, 13 denotes an AND circuit for controlling a gate of the NMOS transistor 12, including an inverter 14 and a NAND circuit 15, 16 denotes a buffer circuit including inverters 17 and 18 and connected to one input of the AND circuit 13, 19 denotes a resistance device inserted between a fuse programming enable (FPEN) signal as an input of the buffer circuit 16 and a ground, and 20 denotes a pad (PAD) connected to an input of the buffer circuit 16. The resistance device 19 is arranged in the I/O cell region 2 with the PAD 20. 21 denotes a level shifter connected to an input of the AND circuit 13 and 22 denotes a control circuit for selecting which fuse device 11 is to be programmed.

A control circuit 22 is formed of a normal logic circuit. A VDD_CORE power source (for example, 1.2 V) is used for the control circuit 22. VDD_IO (for example, 3.3 V), which is a higher voltage than VDD_CORE, is connected to a power source for programming a fuse device 11 to ensure a large current flowing through the fuse device 11. Accordingly, the VDD_IO power source is used for the AND circuit 13 and the buffer circuit 16 for directly controlling the NMOS transistor 12 for programming the fuse device 11.

Figure 3:
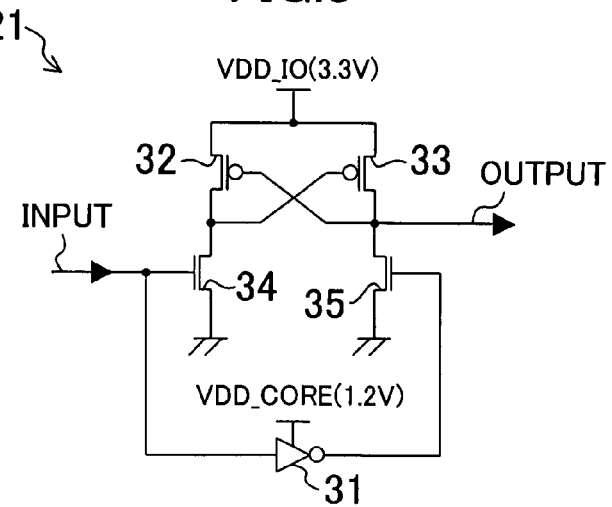
FIG. 3 is a circuit diagram illustrating an exemplary internal configuration of a level shifter of FIG. 2.

FIG. 3 is a circuit diagram illustrating an exemplary internal configuration of a level shifter 21 of FIG. 2. In FIG. 3, 31 denotes an inverter, 32 and 33 denote PMOS transistors, and 34 and 35 denote NMOS transistors. The inverter 31 is connected to the VDD_CORE power source and the PMOS transistors 32 and 33 are connected to the VDD_IO power source.

When the fuse device 11 of FIG. 2 is programmed, a VDD_IO voltage as a FPEN signal is applied to a PAD 20 from the outside of the system LSI 1. Thus, desired one of a plurality of fuse devices 11 on the chip is selected by the control circuit 22. By converting an output signal of the control circuit 22 into the VDD_IO voltage by the level shifter 21, the NMOS transistor 12 is made conductive by the AND circuit 13 so that the desired fuse device 11 can be programmed. That is, a current flows from the VDD_IO power source and part of the fuse device 11 is blown, so that a resistance value is irreversibly changed.

Assume that some other operation than programming is performed. Even though a voltage is not externally applied to the PAD 20, the FPEN signal is fixed to a ground potential due to the function of the resistance device 19 and thus, regardless of an output state of the control circuit 22, the NMOS transistor 12 can be turned OFF by the AND circuit 13. Therefore, the fuse device 11 is not misprogrammed.

The same thing applies to the case when a power source of the system LSI 1 is turned ON/OFF. The system LSI 1 uses a plurality of voltages, and when the power source is turned ON/OFF, the plurality of voltages are turned ON/OFF not at the same time but, for example, in the order of VDD_IO and then VDD_CORE. In this case, a voltage is applied to the fuse device 11 with VDD_IO applied thereto and a voltage is not applied to the control circuit. Thus, because respective complementary inputs of the NMOS transistors 34 and 35 of FIG. 3 are both ground, an output to the level shifter 21 becomes indefinite and one of inputs of the AND circuit 13 becomes indefinite. However, another input of the AND circuit 13 becomes at a ground level due to the FPEN signal pulled down to the ground potential by the resistance device 19, so that regardless of a voltage application state of the control circuit 22, the NMOS transistor 12 is not made conductive. Thus, misprogramming of the fuse device 11 can be prevented. The same thing occurs when the power is OFF.

As described above, with the configuration in which another single input of the AND circuit 13 which uses the same power source as the fuse device 11 uses is pulled down as well as in the control circuit 22 for programming, an excellent electrical fuse circuit in which the fuse device 11 is not misprogrammed even at a time when a power source is turned ON/OFF can be achieved.

In FIG. 2, the case where the buffer circuit 16 is provided is illustrated. However, even when the buffer circuit 16 is not provided and the FPEN signal is directly received by the AND circuit 13, the same effects can be achieved.

Figure 4:
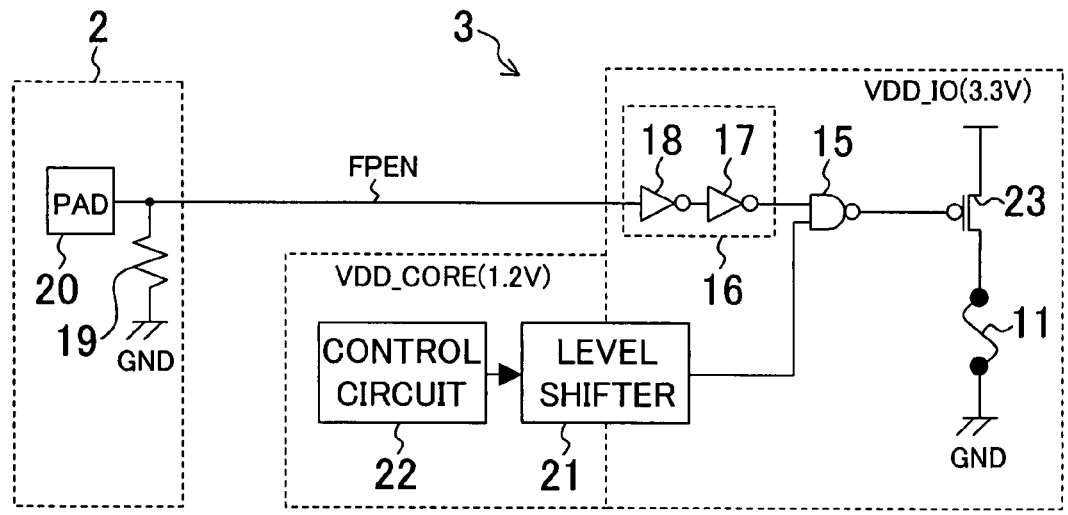
FIG. 4 is a circuit diagram illustrating another exemplary configuration of the electrical fuse circuit of FIG. 1.

FIG. 4 is a circuit diagram illustrating another exemplary configuration of the electrical fuse circuit 3 of FIG. 1. In FIG. 4, 23 denotes a PMOS transistor directly connected to a fuse device 11 and each member also shown in FIG. 2 is identified by the same reference numeral. In the configuration of FIG. 4, because the PMOS transistor 23 programs the fuse device 11, an output of the NAND circuit 15 which uses the VDD_IO power source is directly connected to a gate of the PMOS transistor 23. With this configuration, when the fuse device 11 is programmed, a VDD_IO voltage is applied to the PAD 20 and desired one of a plurality of fuse devices 11 on the chip is selected by the control circuit 22. Thus, each of inputs of the NAND circuit 15 is turned to be a high level to make the PMOS transistor 23 conductive, thereby programming the desired fuse device 11.

When some other operation than programming is performed, even without application of a voltage to the PAD 20, the FPEN signal is made to be a ground level by the resistance device 19 for pulling down, so that regardless of an operation of the control circuit 22, the PMOS transistor 23 can be kept nonconductive. Thus, misprogramming of the fuse device 11 can be prevented. The same thing occurs when the power is turned ON/OFF. Thus, regardless of an application state of a VDD_CORE power source voltage, misprogramming of the fuse device 11 with the VDD_IO power source voltage applied can be prevented.

Figure 5:
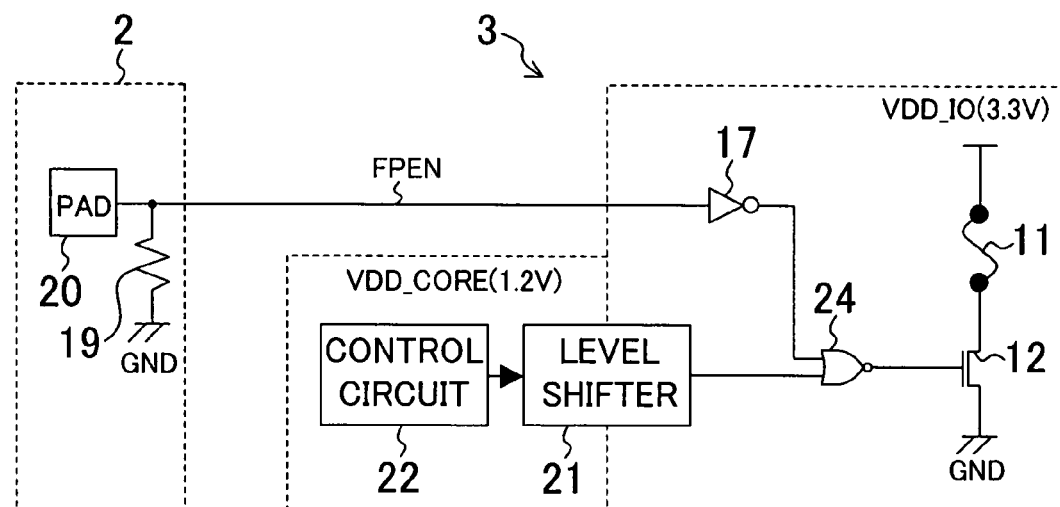
FIG. 5 is a circuit diagram illustrating still another exemplary configuration of the electrical fuse circuit of FIG. 1.

FIG. 5 is a circuit diagram illustrating still another exemplary configuration of the electrical fuse circuit 3 of FIG. 1. In the configuration of FIG. 5, the number of devices, i.e., the AND circuit 13 and the buffer circuit 16 of FIG. 2, is reduced. In FIG. 5, 24 denotes a NOR circuit. As in the configuration of FIG. 2, regardless of an application state of the VDD_CORE power source voltage, an output of the NOR circuit 24 can be fixed to a ground level by turning the FPEN signal to be a ground level to make the NMOS transistor 12 nonconductive, thereby preventing misprogramming of the fuse device 11.

Figure 6:
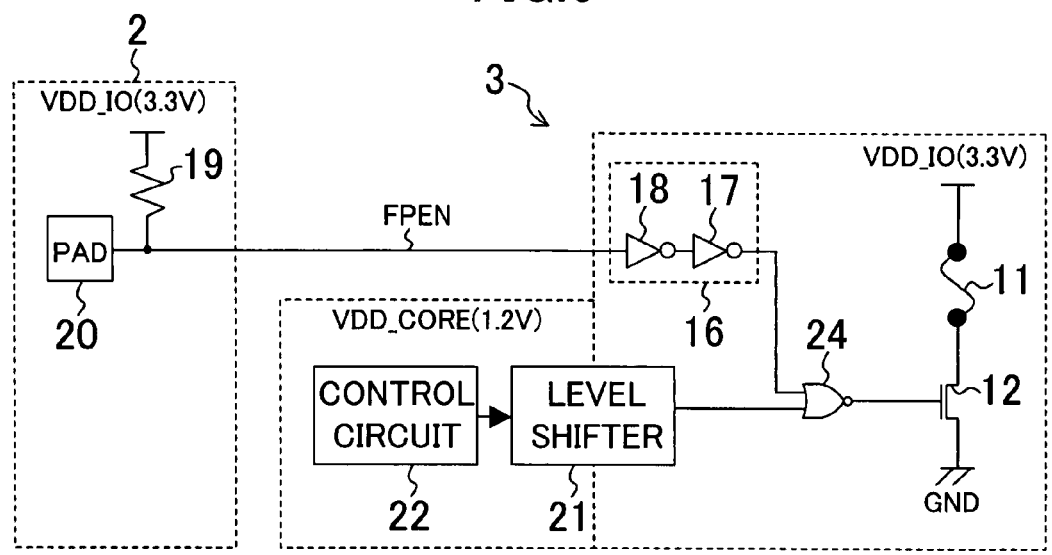
FIG. 6 is a circuit diagram illustrating still another exemplary configuration of the electrical fuse circuit of FIG. 1.

FIG. 6 is a circuit diagram illustrating still another exemplary configuration of the electrical fuse circuit 3 of FIG. 1. In the configuration of FIG. 6, an activation level of the FPEN signal is a ground potential, the FPEN signal in the PAD 20 is pulled up to the VDD_IO power source voltage by the resistance device 19. In this configuration, when some other operation than programming is performed, regardless of an application state of the VDD_CORE power source voltage, an output of the NOR circuit 24 can be fixed to a ground level by fixing the FPEN signal to the VDD_IO voltage to make the NMOS transistor 12 nonconductive, thereby preventing misprogramming of the fuse device 11.

Figure 7:
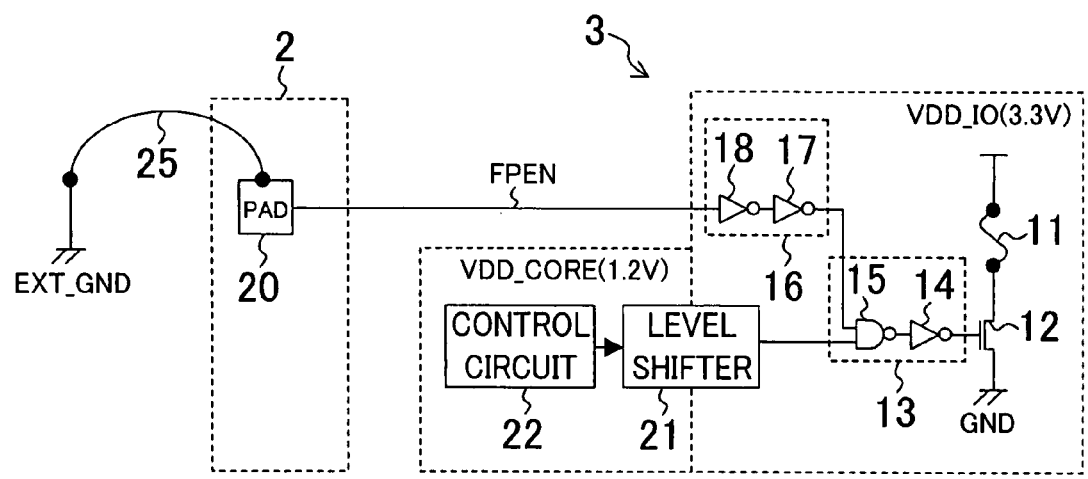
FIG. 7 is a circuit diagram illustrating still another exemplary configuration of the electrical fuse circuit of FIG. 1.

FIG. 7 is a circuit diagram illustrating still another exemplary configuration of the electrical fuse circuit 3 of FIG. 1. In FIG. 7, 25 denotes a wire for connecting the PAD 20 on the system LSI 1 and an external equipment ground (EXT_GND). To prevent misprogramming of the fuse device 11, it is desired that the inside of the system LSI 1 is pulled down. However, if a pull-down resistance device can not be inserted in the I/O cell region 2 for the reason of reduction in area of the I/O cell region 2 or the like, misprogramming of the fuse device 11 can be prevented by connecting a ground (EXT_GND) of equipment to which the system LSI 1 is mounted with the PAD 20. If the resistance device 19 can not be inserted in the I/O cell region 2 in the configuration of FIG. 6, the PAD 20 may be pulled up at the outside of the system LSI 1.

Figure 8:
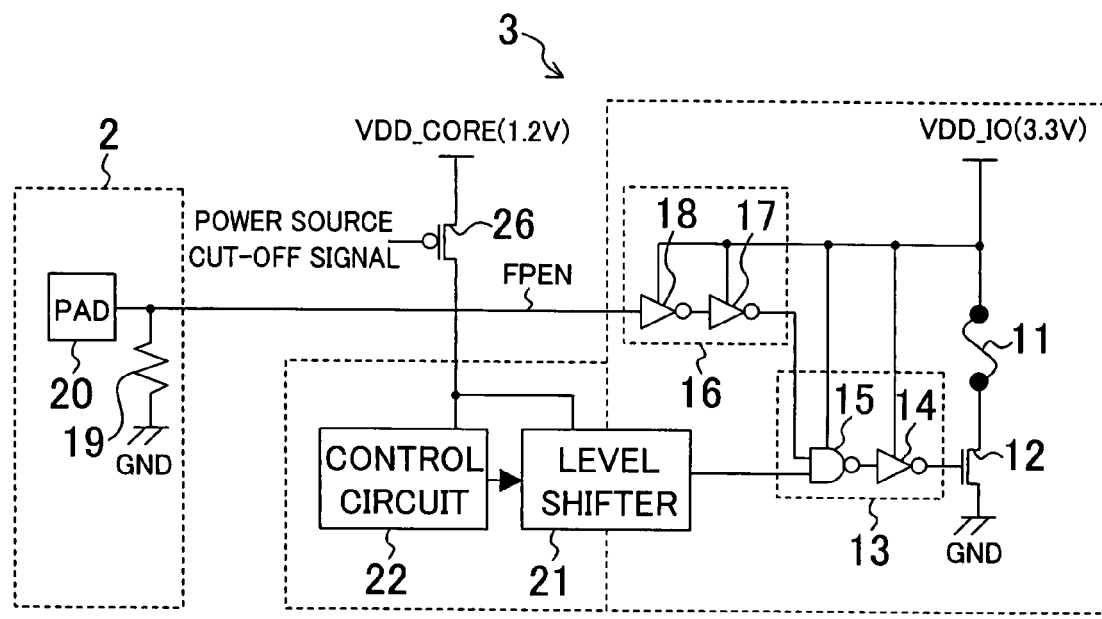
FIG. 8 is a circuit diagram illustrating still another exemplary configuration of the electrical fuse circuit of FIG. 1.

FIG. 8 is a circuit diagram illustrating still another exemplary configuration of the electrical fuse circuit 3 of FIG. 1. In FIG. 8, 26 denotes a PMOS transistor for serving as a switch to cut off connection of the VDD_CORE power source with the control circuit 22 or the like. As a result of cut-off of the control circuit 22 from the VDD_CORE power source, low power consumption can be achieved. Moreover, by adopting a configuration in which connection of the VDD_IO power source with each of the AND circuit 13 for directly controlling the NMOS transistor 12 and the buffer circuit 16 is not cut off, misprogramming of the fuse device 11 can be prevented even when connection of the control circuit 22 with a power source is cut off and also when the control circuit 22 is recovered from a cut-off state.

Figure 9:
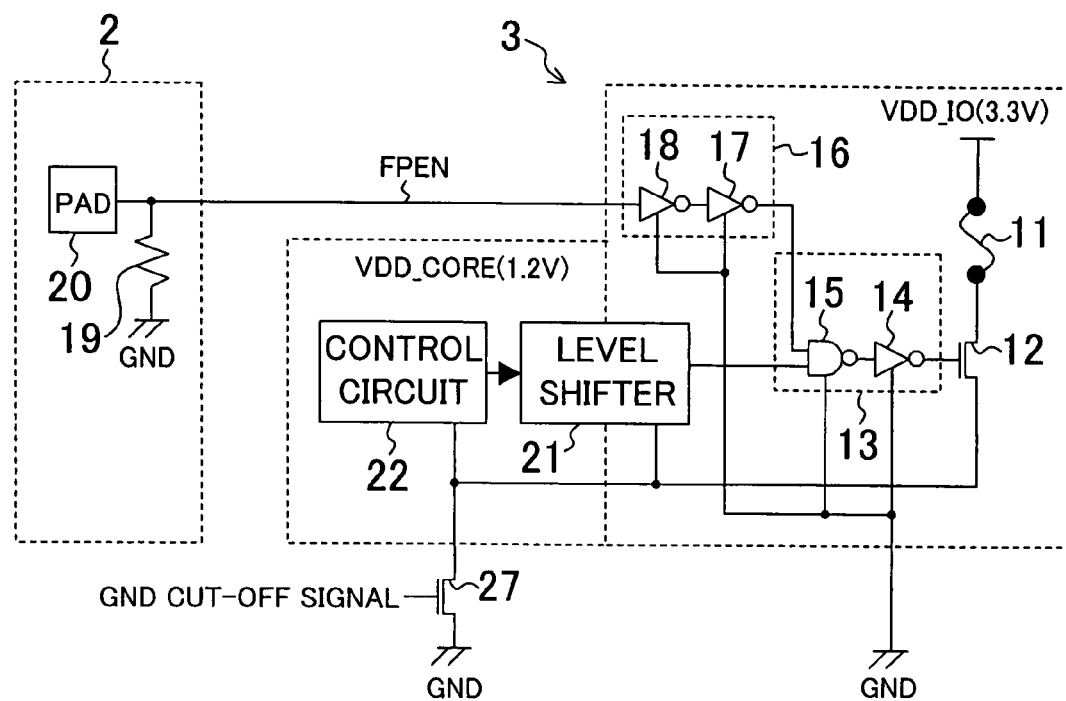
FIG. 9 is a circuit diagram illustrating still another exemplary configuration of the electrical fuse circuit of FIG. 1.

FIG. 9 is a circuit diagram illustrating still another exemplary configuration of the electrical fuse circuit 3 of FIG. 1. In FIG. 9, 27 denotes an NMOS transistor for serving as a switch to cut off connection of a ground with the control circuit 22 or the like. As a result of cut-off of the control circuit 22 from a ground, low power consumption can be achieved. Moreover, by adopting a configuration in which connection of the ground with each of the AND circuit 13 for directly controlling the NMOS transistor 12 and the buffer circuit 16 is not cut off, misprogramming of the fuse device 11 can be prevented when connection of the control circuit 22 with a ground is cut off and also when the control circuit 22 is recovered from a cut-off state.

As has been described, an electrical fuse circuit according to the present invention is widely useful as a program device in an LSI.

What is claimed is:

1. An electrical fuse circuit provided on an LSI, the circuit comprising:
    a series circuit of a fuse device and a MOS transistor;
    a logic circuit including first and second inputs and a single output for controlling a gate of the MOS transistor;
    a program power source for supplying a common power source voltage to the series circuit and the logic circuit;
    a pad for receiving a fuse programming enable signal received from the outside of the LSI and supplying the fuse programming enable signal to the first input of the logic circuit so that when the MOS transistor is made conductive in response to the second input of the logic circuit, a current flows from the program power source to the fuse device and a resistance value of the fuse device is changed;
    potential fixing device for fixing a potential of the pad to a nonactivation level of the fuse programming enable signal so that when the fuse programming enable signal is not received, regardless of a state of the second input of the logic circuit, the MOS transistor is kept nonconductive,
    a control circuit for receiving supply of a power source voltage which is lower than a voltage of the program power source; and
    a level shifter for converting an output of the control circuit into a signal at the voltage level of the program power source and supplying the signal to the second input of the logic circuit,
    wherein the potential fixing device includes, in the LSI, a resistance device for fixing the potential of the pad when the fuse programming enable signal is not received, and the resistance device is disposed with the pad in an input/output cell region.

2. The electrical fuse circuit of claim 1, wherein the potential fixing device further includes, outside of the LSI, means for connecting, when the fuse programming enable signal is not received, the pad to a fixed potential of equipment using the LSI.

3. The electrical fuse circuit of claim 1, wherein the program power source also serves as a cell power source in an input/output cell region of the LSI.

4. The electrical fuse circuit of claim 1, further comprising switch means for cutting off connection of the control circuit with the power source,
    wherein connection of the logic circuit with the power source is not cut off either when the connection of the control circuit with the power source is cut off or when the control circuit is recovered from a cut-off state.

5. The electrical fuse circuit of claim 1, further comprising switch means for cutting off connection of the control circuit with a ground,
    wherein connection of the logic circuit with the ground is not cut off either when the connection of the control circuit with the ground is cut off or when the control circuit is recovered from a cut-off state.

6. The electrical fuse circuit of claim 1, wherein the input/output cell region is disposed in a peripheral portion of the LSI.

* * * * *